United States Patent
Yamamoto

(10) Patent No.: US 10,118,273 B2
(45) Date of Patent: Nov. 6, 2018

(54) POLISHING HEAD, CMP APPARATUS HAVING POLISHING HEAD, AND SEMICONDUCTOR INTEGRATED CIRCUIT MANUFACTURING METHOD USING CMP APPARATUS

(71) Applicant: SII Semiconductor Corporation, Chiba-shi, Chiba (JP)

(72) Inventor: Sukehiro Yamamoto, Chiba (JP)

(73) Assignee: ABLIC Inc. (JP)

( * ) Notice: Subject to any disclaimer, the term of this patent is extended or adjusted under 35 U.S.C. 154(b) by 121 days.

(21) Appl. No.: 15/225,297

(22) Filed: Aug. 1, 2016

(65) Prior Publication Data
US 2017/0036318 A1 Feb. 9, 2017

(30) Foreign Application Priority Data
Aug. 7, 2015 (JP) ................. 2015-157218

(51) Int. Cl.
*B24B 37/20* (2012.01)
*H01L 21/306* (2006.01)

(52) U.S. Cl.
CPC ........ *B24B 37/20* (2013.01); *H01L 21/30625* (2013.01)

(58) Field of Classification Search
CPC ......... B24B 37/20; B24B 37/30; B24B 37/32; B24B 37/04; B24B 49/16; B24B 41/061
USPC .......................................... 451/41, 285–290
See application file for complete search history.

(56) References Cited

U.S. PATENT DOCUMENTS

| 4,436,130 | A | * | 3/1984 | Suzuki | B60C 9/09 152/525 |
| 5,643,053 | A | * | 7/1997 | Shendon | B24B 37/042 451/28 |
| 5,931,719 | A | * | 8/1999 | Nagahara | B24B 37/20 451/287 |
| 6,106,379 | A | * | 8/2000 | Mosca | B24B 37/30 156/345.14 |
| 6,203,414 | B1 | * | 3/2001 | Numoto | B24B 37/30 451/288 |
| 6,857,947 | B2 | * | 2/2005 | Wang | B24B 21/04 451/288 |
| 6,942,546 | B2 | * | 9/2005 | Desai | B24B 21/04 451/288 |
| RE38,878 | E | * | 11/2005 | Hirose | B24B 37/107 451/288 |

(Continued)

OTHER PUBLICATIONS

Abstract, Publication No. JP 2005-268566, Publication date Sep. 29, 2005.

*Primary Examiner* — George Nguyen
(74) *Attorney, Agent, or Firm* — Adams & Wilks

(57) ABSTRACT

A polishing head of a CMP apparatus includes a polishing pad, an air bag brought into contact with a rear surface of a wafer on the polishing pad and configured to press a front surface of the wafer against the polishing pad, and a top ring surrounding the air bag and the wafer. A portion of the air bag brought into contact with a peripheral portion of the wafer is thicker in film thickness than a portion of the air bag brought into contact with a central portion of the wafer. The polishing head is capable of applying even pressure to press down the wafer evenly throughout the entire wafer plane to improve the evenness of polishing.

7 Claims, 15 Drawing Sheets

(56) References Cited

U.S. PATENT DOCUMENTS

| | | | | |
|---|---|---|---|---|
| 7,108,592 B2* | 9/2006 | Fukaya | ................... | B24B 37/30 |
| | | | | 257/E21.23 |
| 7,156,720 B2* | 1/2007 | Saito | ....................... | B24B 37/30 |
| | | | | 451/11 |
| 8,545,289 B2* | 10/2013 | Liao | .................. | H01L 21/67259 |
| | | | | 451/288 |
| 8,932,106 B2* | 1/2015 | Fukushima | ........... | B24B 37/015 |
| | | | | 451/288 |
| 2002/0049030 A1* | 4/2002 | Numoto | .................. | B24B 37/30 |
| | | | | 451/288 |
| 2002/0151255 A1* | 10/2002 | Dyer | .................... | B24B 37/042 |
| | | | | 451/41 |
| 2002/0187728 A1* | 12/2002 | Kiuchi | .................. | B24B 37/015 |
| | | | | 451/5 |
| 2004/0049943 A1* | 3/2004 | Glicksman | ........... | A43B 1/0081 |
| | | | | 36/7.1 R |
| 2005/0003743 A1* | 1/2005 | Minamihaba | ......... | B24B 37/044 |
| | | | | 451/41 |
| 2009/0082870 A1* | 3/2009 | Osman | .................... | A61F 2/441 |
| | | | | 623/17.16 |
| 2009/0098809 A1* | 4/2009 | Shim | ....................... | A63B 45/00 |
| | | | | 451/66 |
| 2009/0244437 A1* | 10/2009 | Yamaguchi | ........ | G02F 1/133308 |
| | | | | 349/60 |
| 2016/0193712 A1* | 7/2016 | Komura | .................. | B24B 37/30 |
| | | | | 451/287 |
| 2017/0050289 A1* | 2/2017 | Shinozaki | ............... | B24B 37/30 |

\* cited by examiner

POLISHING HEAD, CMP APPARATUS HAVING POLISHING HEAD, AND SEMICONDUCTOR INTEGRATED CIRCUIT MANUFACTURING METHOD USING CMP APPARATUS

BACKGROUND OF THE INVENTION

1. Field of the Invention

The present invention relates to the structure of a polishing head for a CMP apparatus configured to planarize a wafer plane evenly throughout the wafer plane, a CMP apparatus that includes the polishing head, and a semiconductor integrated circuit manufacturing method using the CMP polishing apparatus.

2. Description of the Related Art

In recent years, new microfabrication technologies have been developed as the level of integration and performance of semiconductor integrated circuits (hereinafter abbreviated as LSIs) has increased. Chemical mechanical polishing (hereinafter abbreviated as CMP) is one of the new technologies, and is used frequently in LSI manufacturing processes, in particular, steps included in a multi-layer wiring forming process which are the planarizing of an interlayer insulating film, the forming of a metal plug, and the forming of embedded wiring. The basic structure of CMP apparatus includes a rotating platen to which a polishing pad is stuck, a wafer holding head, and a slurry feeding nozzle, and a pad renewing device (a conditioner) is further included. The polishing pad side is not always the rotating platen. There are cases where the CMP apparatus includes a plurality of pads for one head, and then there are the opposite cases where the CMP apparatus includes a plurality of heads for one pad. Parameters for controlling CMP apparatus include, other than the method of polishing, polishing load, the rotation speed of the platen, the rotation speed of the head, the method of selecting and feeding slurry, the conditions and frequency of conditioning, and the like. One way to control CMP apparatus is pressurizing an airbag against a head portion to which a wafer is fixed as illustrated in FIG. 13 (see, for example, Japanese Patent Application Laid-open No. 2005-268566).

However, the head structure disclosed in Japanese Patent Application Laid-open No. 2005-268566 in which a wafer is fixed through pressurization with the use of an air bag has the following inconveniences. Specifically, the pressure from the pressurized air bag is locally high along a peripheral portion of the air bag, and an wafer region that is in contact with that portion is pressed to the polishing pad more firmly than other wafer regions, which means that more polishing target insulating material is polished off than in other wafer regions. With too much polishing target insulating material polished off in a partial region of the wafer, the degree of polishing is uneven throughout the wafer plane, and the film thickness of the insulating material is fluctuated throughout the wafer plane as a result. Wafer regions where the film thickness is fluctuated have electrical characteristics fluctuations, which may cause anomaly in electrical characteristics.

FIG. 14 is a schematic diagram of the film fluctuations. As illustrated in FIG. 14, compressed air is introduced in the related art in order to press down a wafer 1, and high pressure 6 higher than the pressure in a central portion of the air bag applies locally to a peripheral portion of the air bag. In the portion of the wafer 1 that is pressed down from above by the high pressure portion, the rate of insulating film polishing rises in a high pressurization region X, where the pressure is intense, and more insulating film is polished off than in the central portion where the wafer 1 is pressed under less pressure. This lowers the in-plane evenness in the high pressurization region X of the wafer 1 after the planarizing of the insulating film material.

SUMMARY OF THE INVENTION

The present invention has been made in view of the inconveniences described above, and hence an object of the present invention is to provide a CMP apparatus improved in polishing evenness.

In order to attain this object, the present invention uses the measures given below. Specifically, an air bag for a head of the CMP apparatus has the following features:

1. A portion of a bag body that is in contact with a peripheral portion of a wafer is made thicker than a portion of the bag body that is in contact with a central portion of the wafer.
2. The air bag is divided.
3. The air bag is shaped like a hose.

A CMP apparatus having a polishing head that is capable of applying even pressure and pressing down a wafer evenly throughout the entire wafer plane is attained by taking the above-mentioned measures alone or in combination.

By taking the measures described above, a semiconductor integrated circuit manufacturing method can be provided in which the airbag configured to press down a wafer is pressurized evenly, the wafer can be pressed down evenly throughout the entire wafer plane, and the film thickness fluctuations of an insulating material of the wafer are reduced throughout the wafer plane.

DETAILED DESCRIPTION OF THE INVENTION

Modes of carrying out the present invention are described below through embodiments with reference to the drawings.

Figure 1:
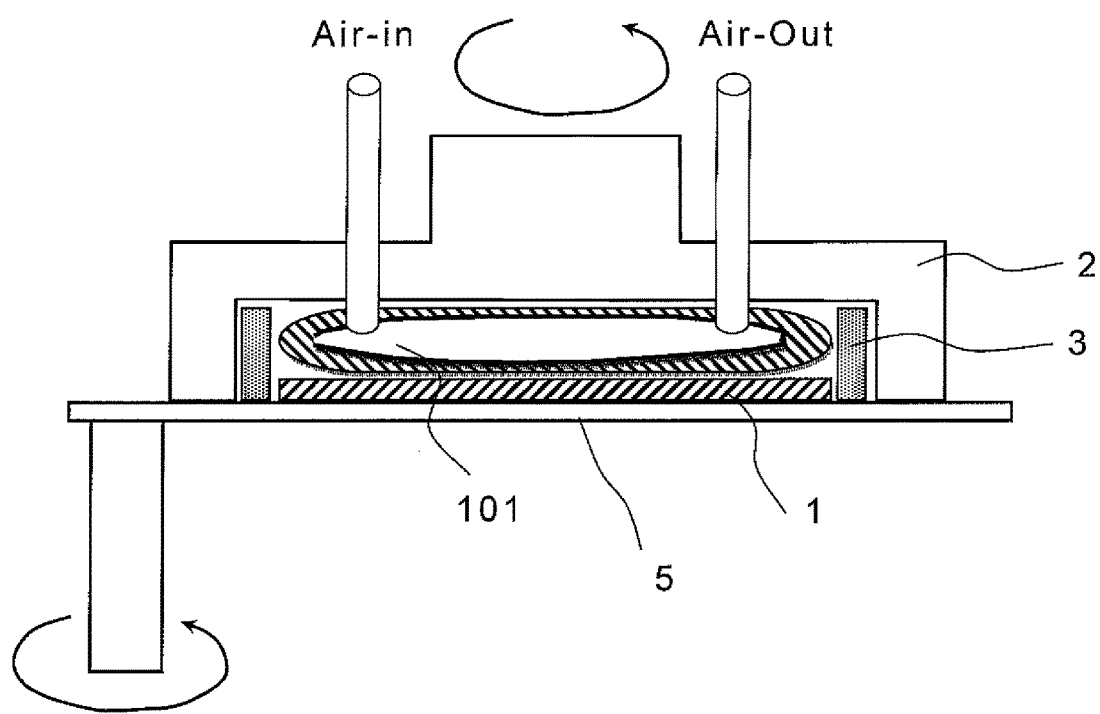
FIG. 1 is a schematic sectional view of a polishing head of a CMP apparatus according to a first embodiment of the present invention.

FIG. 1 is a schematic sectional view of a first embodiment of the present invention for schematically illustrating a CMP apparatus, in particular, the sectional structure of a polishing head portion. As described above, when compressed air is introduced in order to press down the wafer 1 in the related art illustrated in FIG. 14, the high pressure 6 higher than pressure in the central portion is applied locally to the peripheral portion due to the shape of the air bag or the like. In the portion of the wafer 1 that is pressed down from above by the high pressure portion, the rate of insulating film polishing rises in the high pressurization region X, where the pressure is intense, and more insulating film is polished off than in the central portion where the wafer 1 is pressed under less pressure. The in-plane evenness of the wafer 1 after the planarizing of the insulating film material is consequently poor.

In the CMP apparatus of FIG. 1, an air bag 101 is placed on a rear surface of a wafer 1, which is mounted on a polishing pad 5 with its front surface facing downward, and compressed air is fed to the air bag 101, thereby pressing down the wafer 1 from above and fixing the wafer 1 onto the front surface of the wafer 1 pressed against the polishing pad 5. A retainer ring 3 is arranged so as to surround the wafer 1 and the air bag 101 from the side, and all three are surrounded by a top ring 2. The polishing pad 5 is placed under the wafer 1 to polish and planarize an insulating material on the front surface of the wafer 1 while the top ring 2 including the wafer 1 is rotating on the polishing pad 5.

The air bag 101 includes a bag body formed into a film that increases in thickness from the center of the bag body outward. The range in which the film of the bag body is thick is determined by checking the polishing rate at points all over the wafer 1 based on the configuration of the CMP apparatus and on the shape of the wafer 1, and may be designed so that the thickness is optimized from a region where the polishing rate becomes high toward the periphery of the air bag 101. The designing can use an actual measurement value obtained in the related art for the width of a region where the polishing rate rises due to being pressed under high pressure. The pressure on the wafer 1 is more dispersed in the thick portion than in an air bag that has the thickness of the related art.

An air bag having the thickness of the related art has a problem in that high pressure is applied locally to a peripheral portion of the air bag, which causes an increase in polishing rate and the polishing off of too much insulating material in the peripheral portion. By optimizing the thickness of the air bag 101 outward, the high pressure applied locally to the periphery of the air bag 101 alone is dispersed, and the pressure from the air bag 101 with which the wafer 1 is pressed down is made even in the central portion and the peripheral portion. The resultant advantage is that an insulating film material is formed into a film that is uniformly high in quality throughout the entire wafer 1.

As is understood from the description given above, the first embodiment of the present invention has a feature in that the wafer 1 can be pressed down evenly by optimizing the thickness of the air bag 101 outward and thus dispersing the air pressure in the air bag 101 evenly.

Figure 2:
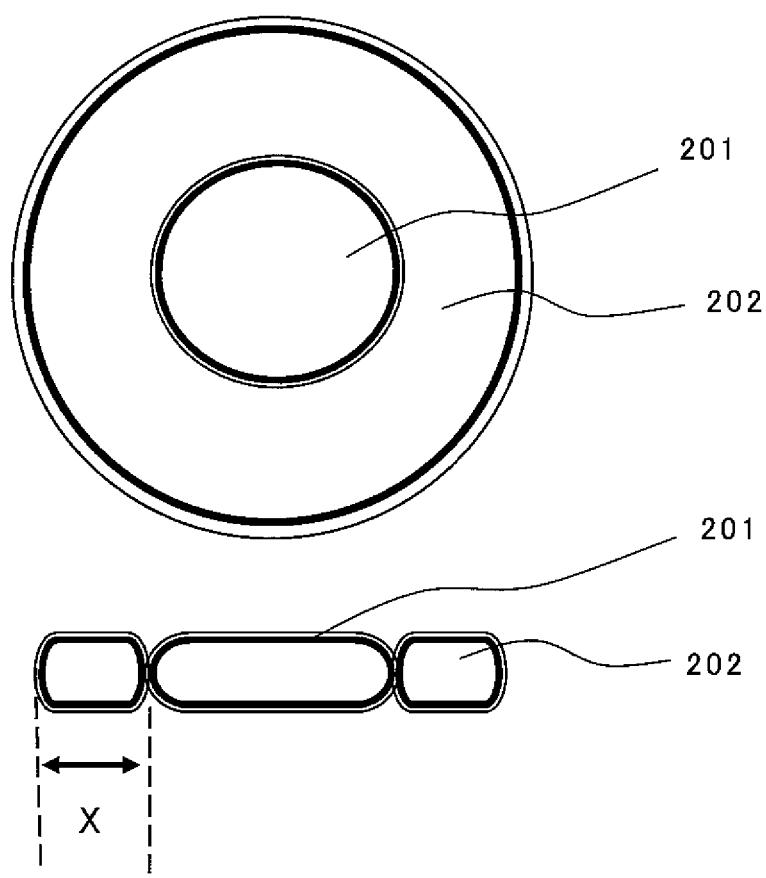
FIG. 2 is a schematic plan view and sectional view of an air bag in a polishing head of a CMP apparatus according to a second embodiment of the present invention.
Figure 14:
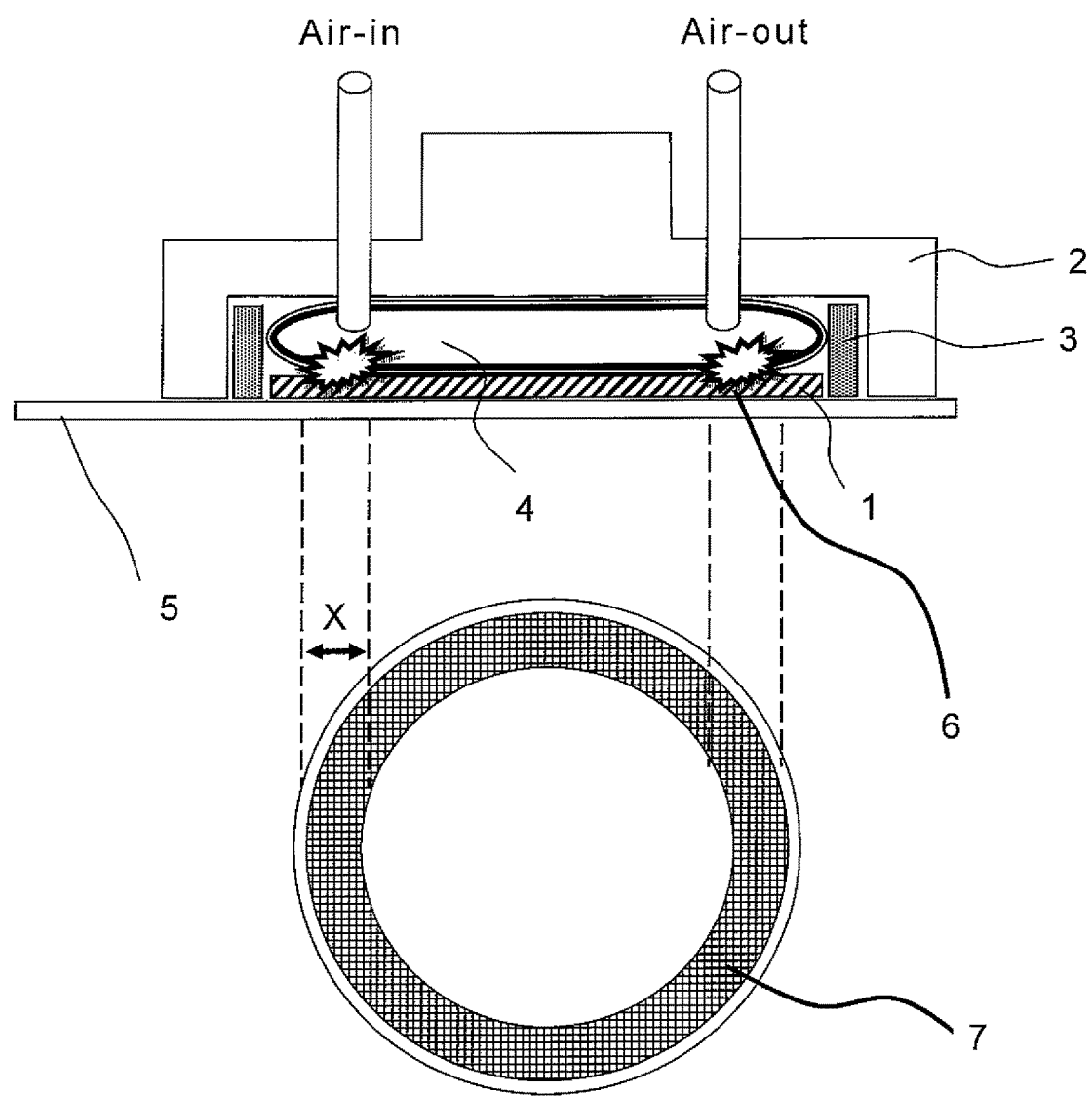
FIG. 14 is a schematic diagram for illustrating remaining film fluctuations throughout the wafer plane after polishing with the CMP apparatus of the related art.

FIG. 2 is a schematic sectional view of a second embodiment of the present invention as a simple illustrating of an air bag alone out of components of a CMP apparatus. First, a region to which high air pressure from the air bag is applied locally as illustrated in FIG. 14 is already known in the related art, which is a region where the increased rate of insulating film material polishing lowers the evenness of planarizing. Factors that increase the pressure of the air bag outward are also known, such as forming the air bag from a single member, and the centrifugal force at work due to the rotation of the head.

The air bag in the embodiment of FIG. 2 is hence divided into two bag bodies, that is, an inner air bag 201, which is circular, and an outer air bag 202, which has a torus shape and is arranged so as to surround the inner air bag 201. A region in which the polishing rate rises is known as the peripheral area where the air pressure in the air bag is high in the related art as described above, and the width of the outer air bag 202 is set so as to be wide enough to cover the width of this region. The pressure in the inner air bag 201 and the pressure in the outer air bag 202 can be controlled independently of each other. As is understood from the description given above, the second embodiment has a feature in that the wafer 1 can be pressed down evenly by forming an air bag from two bags that can be controlled in pressure independently of each other, and thus dispersing evenly the pressure from the air bag that presses down on the central portion of the wafer 1 and the pressure from the air bag that presses down on the peripheral portion of the wafer 1.

Figure 3:
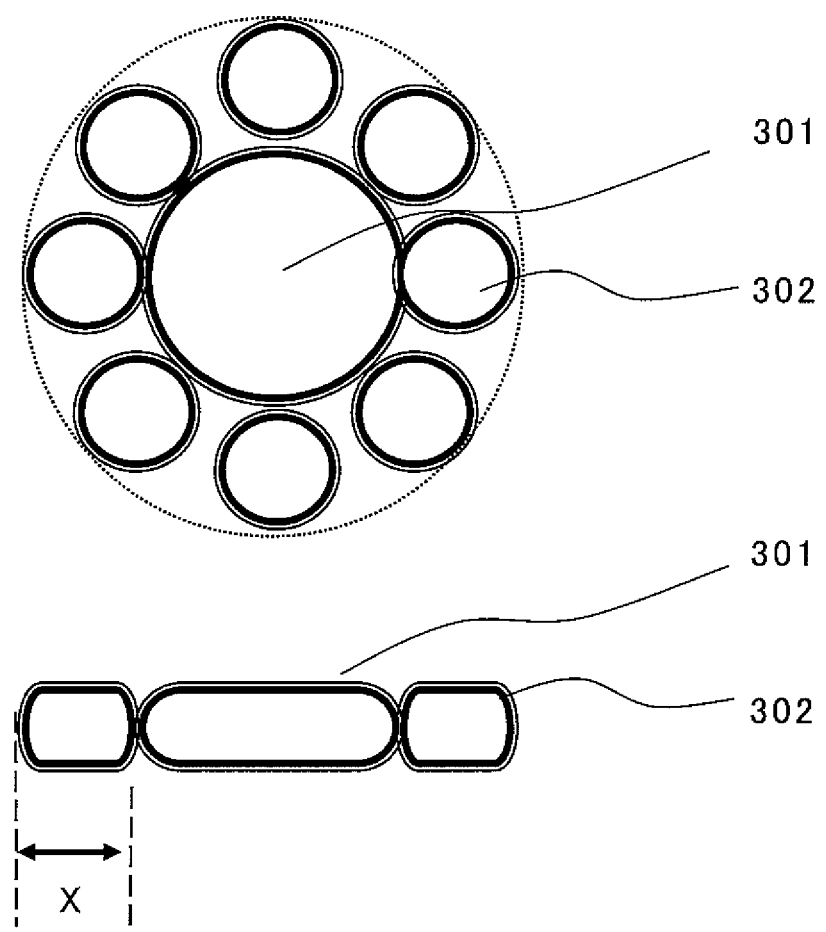
FIG. 3 is a schematic plan view and sectional view of an air bag in a polishing head of a CMP apparatus according to a third embodiment of the present invention.

FIG. 3 is a schematic sectional view of a third embodiment of the present invention as a simple illustrating of an air bag alone out of components of a CMP apparatus. The third embodiment includes an inner air bag 301 and an outer air bag 302 as in the second embodiment, except that the outer airbag 302 is shaped into a small circle and that a ring of outer air bags 302 is arranged around the inner air bag 301. Shaping each outer air bag 302 into a small circle has an advantage in that the air pressure from the air bags 302 is applied more evenly than from the torus-shaped air bag of the second embodiment and consequently presses down the wafer 1 evenly. As is understood from the description given above, the third embodiment has a feature in that the wafer 1 can be pressed down evenly by forming an air bag from two types of circles, and thus dispersing the pressure from the air bag that presses down on the central portion of the wafer 1 and the pressure from the air bag that presses down on the peripheral portion of the wafer 1 more evenly than in the second embodiment. The pressure in the large circular inner air bag and the pressure in the small outer air bags can be controlled independently of each other.

Figure 4:
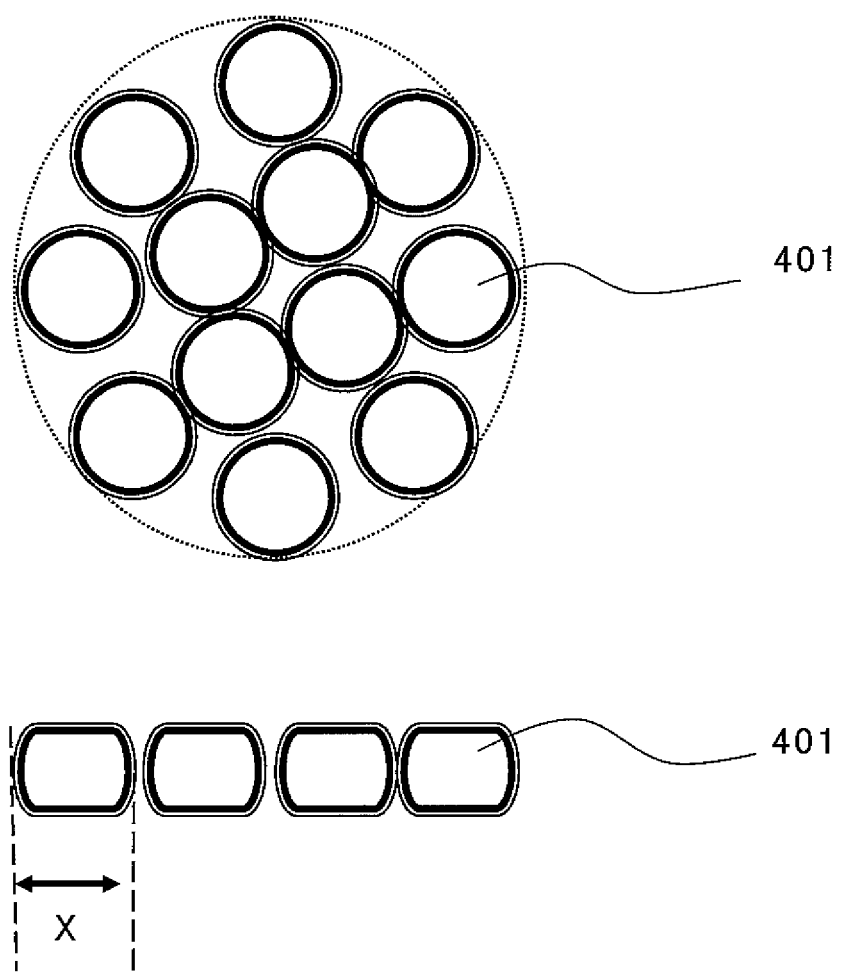
FIG. 4 is a schematic plan view and sectional view of an air bag in a polishing head of a CMP apparatus according to a fourth embodiment of the present invention.

FIG. 4 is a schematic sectional view of a fourth embodiment of the present invention as a simple illustrating of an air bag alone out of components of a CMP apparatus. While the inner air bag 301 is surrounded by the outer air bags 302 in the arrangement described in the third embodiment, the air bag in the fourth embodiment is made up of small air bags 401, which are each the singular inner air bag 301 that is resized to have the size of each outer air bag 302. Forming an air bag entirely from the small air bags 401 as opposed to the third embodiment has an advantage in that the air pressure from the small air bags 401 is applied more evenly than from a large air bag. The pressure in one small air bag 401 and the pressure in another small air bag 401 can be controlled independently of each other.

As is understood from the description given above, the fourth embodiment has a feature in that the pressure that presses down on the wafer 1 can be made more even throughout the entire wafer 1 by forming an air bag entirely from the small air bags 401 and thus applying the air pressure from the small air bags 401 more evenly than from a large air bag.

Figure 5:
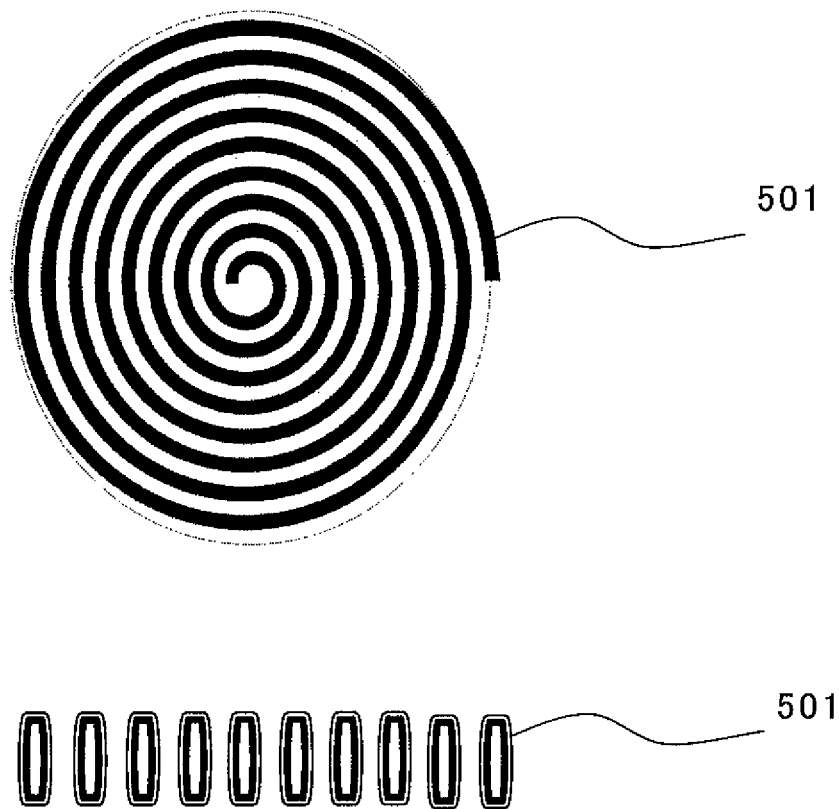
FIG. 5 is a schematic plan view and sectional view of an air bag in a polishing head of a CMP apparatus according to a fifth embodiment of the present invention.

FIG. 5 is a schematic sectional view of a fifth embodiment of the present invention as a simple illustrating of an air bag alone out of components of a CMP apparatus. When the air bag for a CMP apparatus is a single large air bag as in FIG. 13, which is for illustrating the related art, or in the first embodiment, the air pressure from the air bag is dispersed locally, resulting in an inconvenience of unevenness in pressure with which the wafer is pressed down. To solve the inconvenience, an air bag shaped like a hose is arranged into a spiral pattern as a hose-shaped air bag spiral form 501 as illustrated in FIG. 5. An optimum spiral direction may be selected from the left-handed direction and the right-handed direction. An advantage of a hose-shaped narrow air bag is that the air pressure from the air bag is applied evenly. As is understood from the description given above, the fifth embodiment has a feature in that the pressure that presses down on the wafer 1 can be made more even throughout the entire wafer 1 by forming the hose-shaped air bag spiral form 501 as the air bag and thus applying the air pressure from the air bag more evenly than in FIG. 13 of the related art, or in the first embodiment. The pressure with which the wafer is pressed down in this embodiment can be evened out further by setting the hose diameter of the hose-shaped air bag smaller in a portion that is in contact with the wafer's peripheral portion than in a portion that is in contact with the wafer's central portion.

Figure 6:
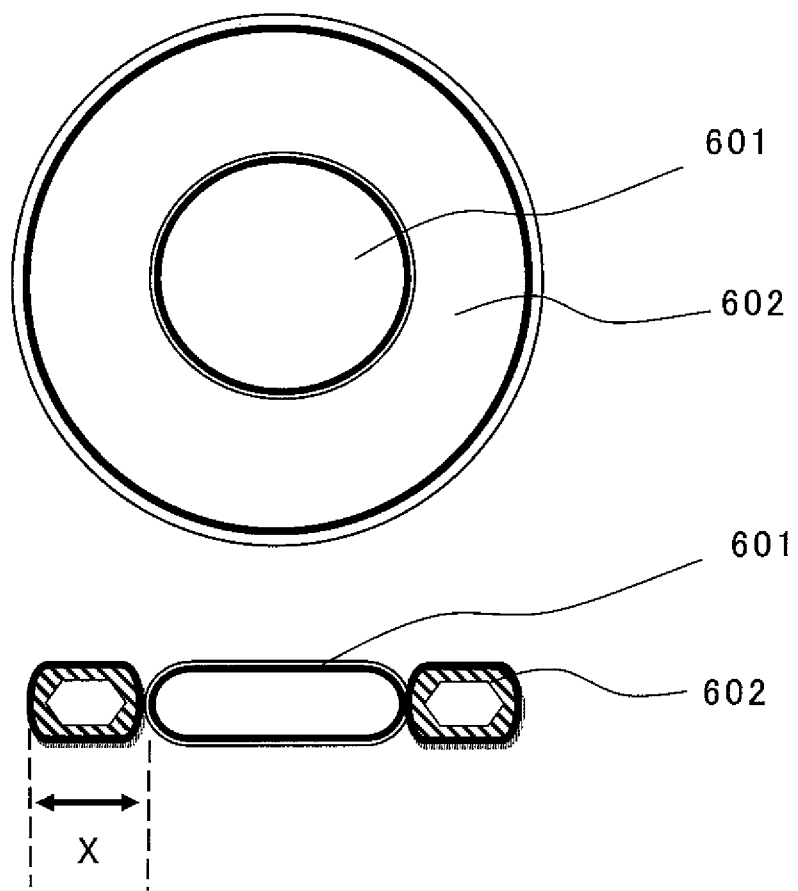
FIG. 6 is a schematic plan view and sectional view of an air bag in a polishing head of a CMP apparatus according to a sixth embodiment of the present invention.

FIG. 6 is a schematic sectional view of a sixth embodiment of the present invention as a simple illustrating of an air bag alone out of components of a CMP apparatus. The sixth embodiment has the features of both the first embodiment and the second embodiment. That is, an inner air bag 601, which is circular, is surrounded by a torus-shaped outer air bag 602, and the outer air bag 602 is made from a thick material. The circumferential force due to the rotation of a head for the CMP apparatus makes the pressure applied to the peripherally located air bag higher than the pressure applied to the centrally located air bag. Forming an air bag material thicker than in the peripheral portion than in the central portion has an advantage in that the wafer 1 is pressed down evenly by applying the air pressure from the air bags evenly. As is understood from the description given above, the sixth embodiment has a feature in that the pressure that presses down on the wafer 1 can be made more even throughout the entire wafer 1 by forming the outer air bag 602 from a thick material and thus applying the air pressure from the air bags more evenly than in the second embodiment.

Figure 7:
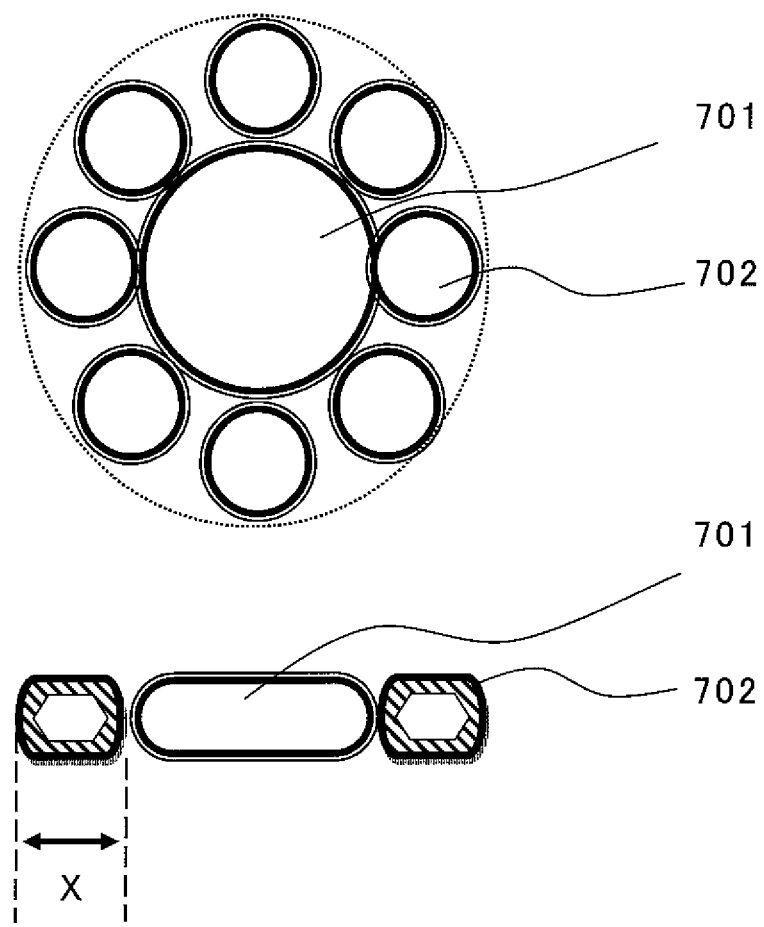
FIG. 7 is a schematic plan view and sectional view of an air bag in a polishing head of a CMP apparatus according to a seventh embodiment of the present invention.

FIG. 7 is a schematic sectional view of a seventh embodiment of the present invention as a simple illustrating of an air bag alone out of components of a CMP apparatus. The seventh embodiment has the features of both the first embodiment and the third embodiment. That is, small circular outer air bags 702 are arranged so as to surround a circular inner air bag 701, and the outer air bags 702 are made from a thick material. The circumferential force due to the rotation of a head for the CMP apparatus makes the pressure applied to the peripherally located air bag higher than the pressure applied to the centrally located air bag. Forming an air bag material thicker than in the peripheral portion than in the central portion has an advantage in that the wafer 1 is pressed down evenly by applying the air pressure from the air bags evenly. As is understood from the description given above, the seventh embodiment has a feature in that the pressure that presses down on the wafer 1 can be made more even throughout the entire wafer 1 by forming the outer air bags 702 from a thick material and thus applying the air pressure from the air bags more evenly than in the third embodiment.

Figure 8:
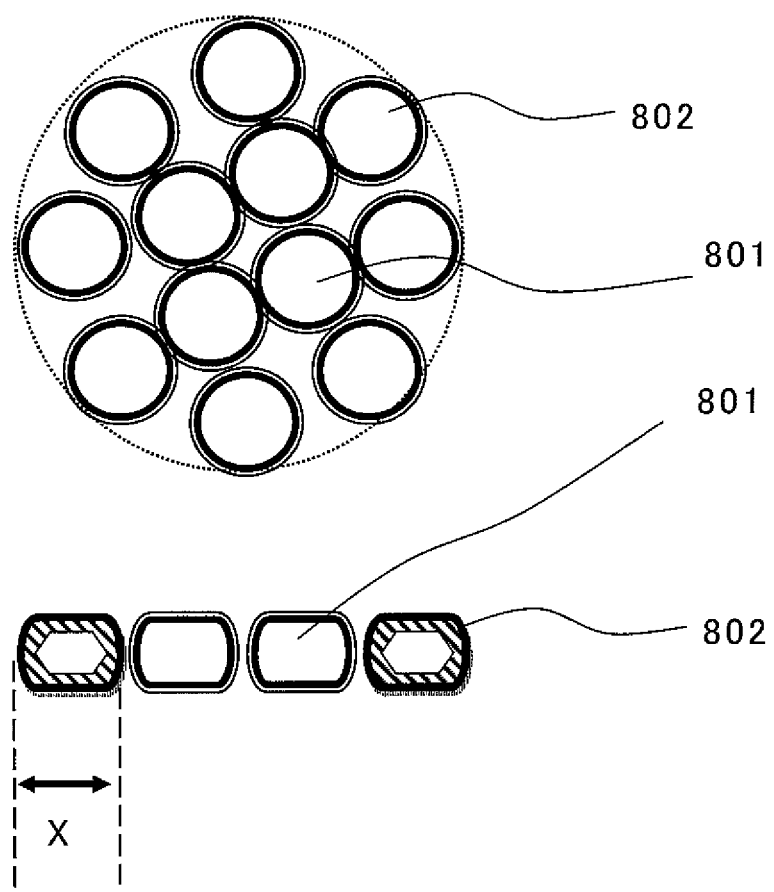
FIG. 8 is a schematic plan view and sectional view of an air bag in a polishing head of a CMP apparatus according to an eighth embodiment of the present invention.

FIG. 8 is a schematic sectional view of an eighth embodiment of the present invention as a simple illustrating of an air bag alone out of components of a CMP apparatus. The eighth embodiment has the features of both the first embodiment and the fourth embodiment. That is, small air bags 801 are arranged, and the outermost small air bags 802 are made from a thick material. The circumferential force due to the rotation of a head for the CMP apparatus makes the pressure applied to the peripherally located air bag higher than the pressure applied to the centrally located airbag. Forming an air bag material thicker than in the peripheral portion than in the central portion has an advantage in that the wafer 1 is pressed down evenly by applying the air pressure from the air bags evenly. As is understood from the description given above, the eighth embodiment has a feature in that the pressure that presses down on the wafer 1 can be made more even throughout the entire wafer 1 by forming the outer air bags 802 from a thick material and thus applying the air pressure from the air bags more evenly than in the fourth embodiment.

Figure 9:
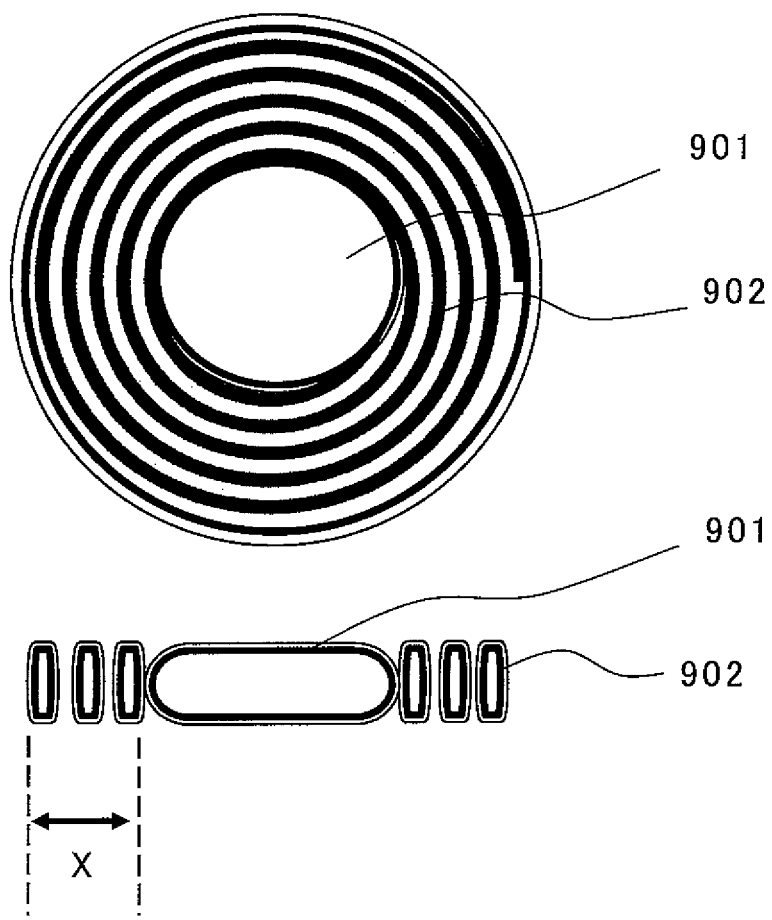
FIG. 9 is a schematic plan view and sectional view of an air bag in a polishing head of a CMP apparatus according to a ninth embodiment of the present invention.
Figure 13:
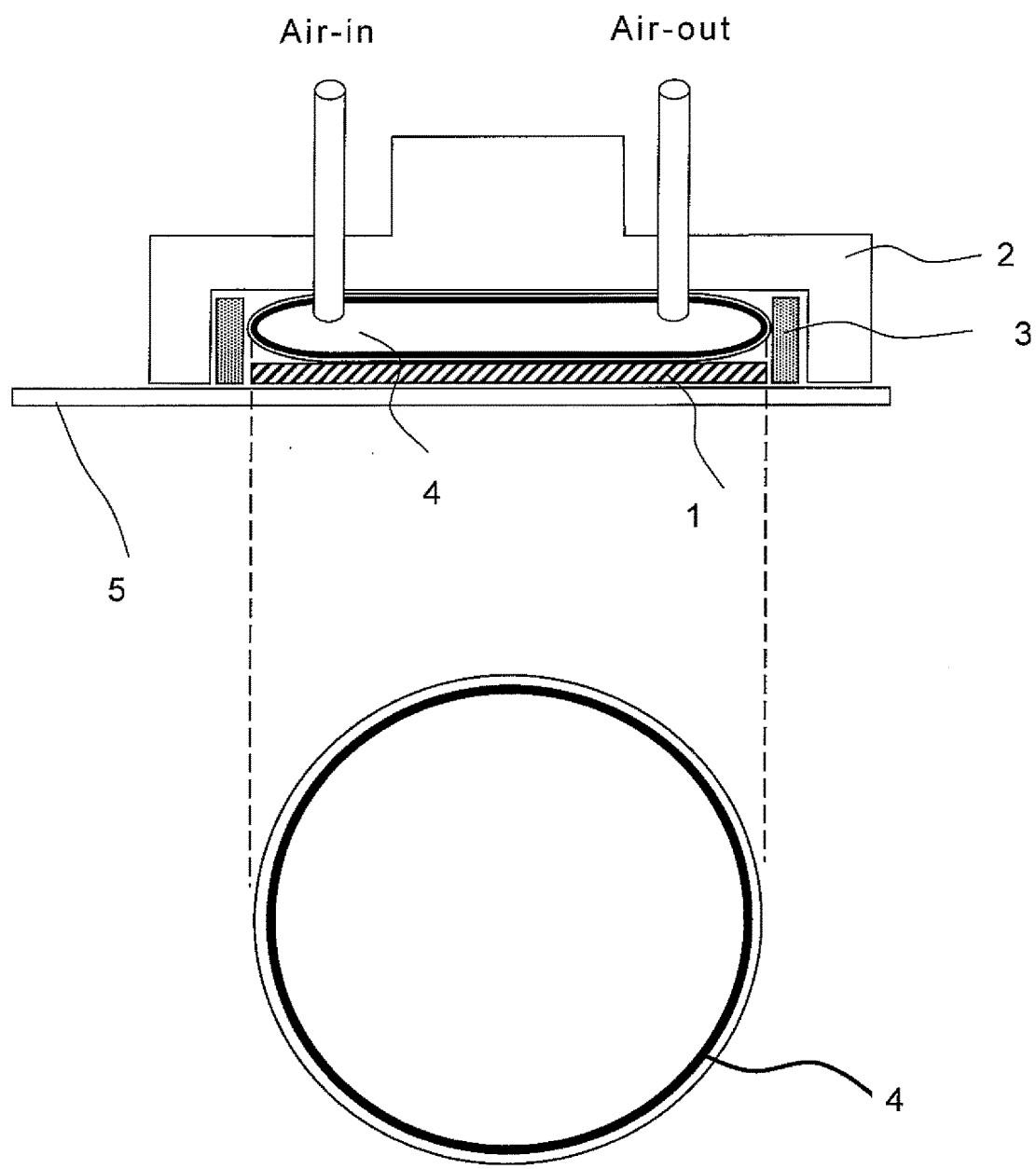
FIG. 13 is a schematic plan view and schematic sectional view of a polishing head of a CMP apparatus according to the related art.

FIG. 9 is a schematic sectional view of a ninth embodiment of the present invention as a simple illustrating of an air bag alone out of components of a CMP apparatus. The ninth embodiment has the features of both the second embodiment and the fifth embodiment, and a hose-shaped air bag spiral form 902 is arranged so as to surround a circular inner air bag 901. A spiral optimum for the hose-shaped air bag spiral form 902 may be selected from a right-handed spiral and a left-handed spiral. With a single air bag as in FIG. 13, illustrating the related art, the air pressure in the air bag is higher in the peripheral portion of the air bag than in the central portion of the air bag. Pushing down of the wafer 1 by the high pressure air causes a problem in that the polishing rate rises in the peripheral portion, thereby polishing off too much insulating film and lowering the evenness of planarizing. Forming an air bag from two bags and forming the hose-shaped air bag spiral form 902 in a region in which the polishing rate rises in the peripheral portion and which is obtained with the related art has an advantage in that the pressure that presses down on the wafer 1 is evened throughout the entire wafer 1 by making the pressure in the central portion and the pressure in the peripheral portion even. As is understood from the description given above, the ninth embodiment has a feature in that the pressure that presses down on the wafer 1 can be made more even throughout the entire wafer 1 by surrounding the circular inner air bag 901 with the hose-shaped air bag spiral form 902, and thus applying the air pressure from the air bag more evenly than in the second embodiment.

Figure 10:
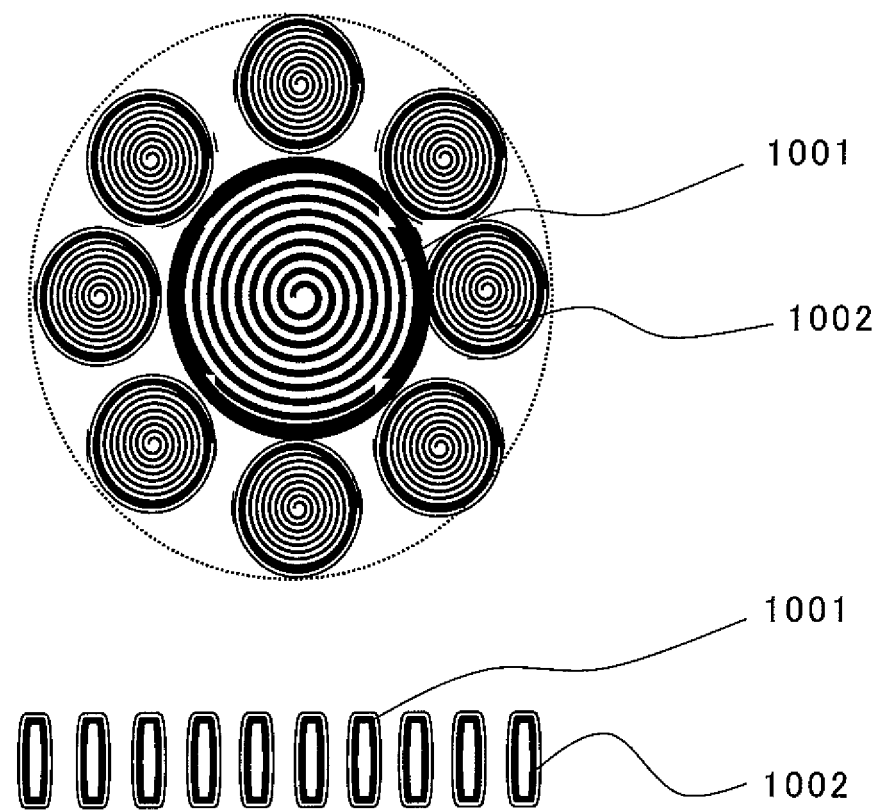
FIG. 10 is a schematic plan view and sectional view of an air bag in a polishing head of a CMP apparatus according to a tenth embodiment of the present invention.

FIG. 10 is a schematic sectional view of a tenth embodiment of the present invention as a simple illustrating of an air bag alone out of components of a CMP apparatus. The tenth embodiment has the features of both the third embodiment and the fifth embodiment, and an inner hose-shaped air bag spiral form 1001, which is a hose-shaped air bag coiled so as to have a circular outline, is surrounded by small outer hose-shaped air bag spiral forms 1002. A spiral optimum for the inner hose-shaped air bag spiral form 1001 may be selected from a right-handed spiral and a left-handed spiral, and an optimum spiral may be selected similarly for each outer hose-shaped air bag spiral form 1002. With a single air bag as in FIG. 13, which is for illustrating the related art, the air pressure in the air bag is higher in the peripheral portion of the air bag than in the central portion of the air bag. Pushing down of the wafer 1 by high pressure causes a problem in that the polishing rate rises in the peripheral portion, thereby polishing off too much insulating film and lowering the evenness of planarizing. Forming a hose-shaped, spiral-form air bag from the inner hose-shaped air bag spiral form 1001 and the outer hose-shaped air bag spiral forms 1002, and forming the outer hose-shaped air bag spiral forms 1002 in a region in which the polishing rate rises in the peripheral portion and which is obtained from a substantiated value of the related art has an advantage in that the evenness of the air pressure in the air bag in the central portion and the peripheral portion is improved from the fifth embodiment. As is understood from the description given above, the tenth embodiment has a feature in that the pressure that presses down on the wafer 1 can be made more even throughout the entire wafer 1 by surrounding the inner hose-shaped air bag form 1001, which is a hose-shaped air bag coiled so as to have a circular outline, with the small outer hose-shaped air bag spiral forms 1002, and thus applying the air pressure from the air bag more evenly to the central portion and the peripheral portion than in the third embodiment.

Figure 11:
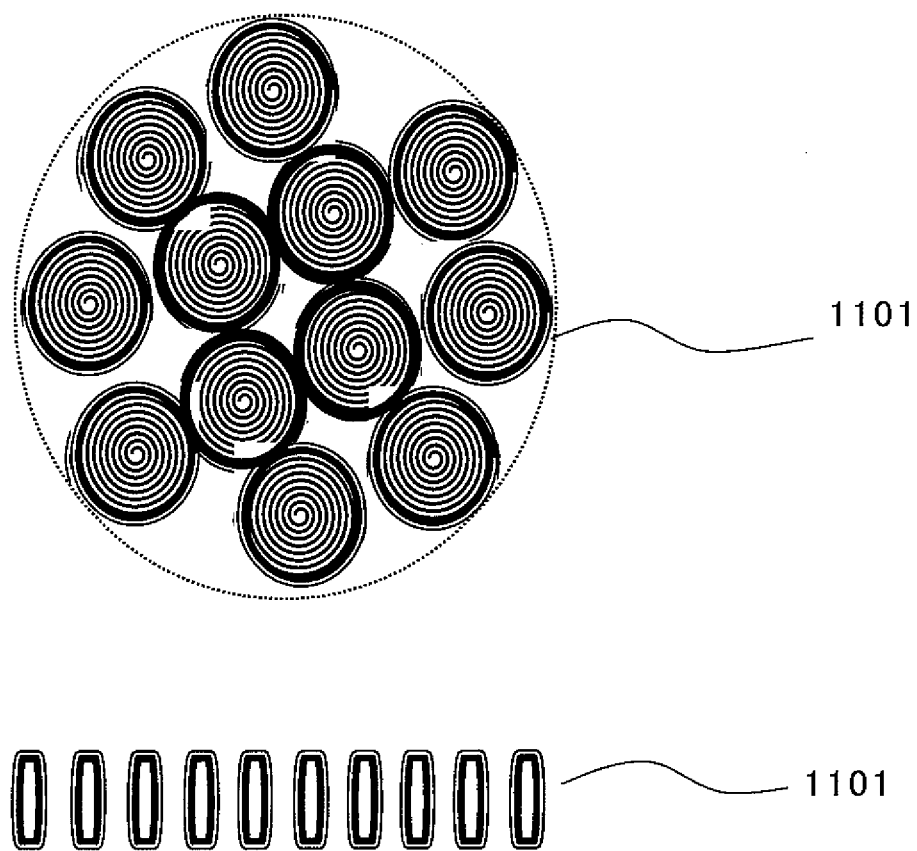
FIG. 11 is a schematic plan view and sectional view of an air bag in a polishing head of a CMP apparatus according to an eleventh embodiment of the present invention.

FIG. 11 is a schematic sectional view of an eleventh embodiment of the present invention as a simple illustrating of an air bag alone out of components of a CMP apparatus. The eleventh embodiment has the features of both the fourth embodiment and the fifth embodiment, and the air bag is made up of small hose-shaped air bag spiral forms 1101. An optimum spiral may be selected from a right-handed spiral and a left-handed spiral. With a single air bag as in FIG. 13, illustrating the related art, the air pressure in the air bag is higher in the peripheral portion of the air bag than in the central portion of the air bag. Pushing down of the wafer 1 by the high pressure air causes a problem in that the polishing rate rises in the peripheral portion, thereby polishing off too much insulating film and lowering the evenness of planarizing. Forming the small hose-shaped air bag spiral forms 1101 in the central portion and in a region in which the polishing rate rises in the peripheral portion and which is obtained from a substantiated value of the related art has an advantage in that the evenness of the air pressure in the airbag in the central portion and the peripheral portion is improved from the fourth embodiment. As is understood from the description given above, the eleventh embodiment has a feature in that the pressure that presses down on the wafer 1 can be made more even throughout the entire wafer 1 by forming an air bag from the small hose-shaped air bag spiral forms 1101 and thus applying the air pressure from the air bag more evenly to the central portion and the peripheral portion than in the fourth embodiment.

Figure 12:
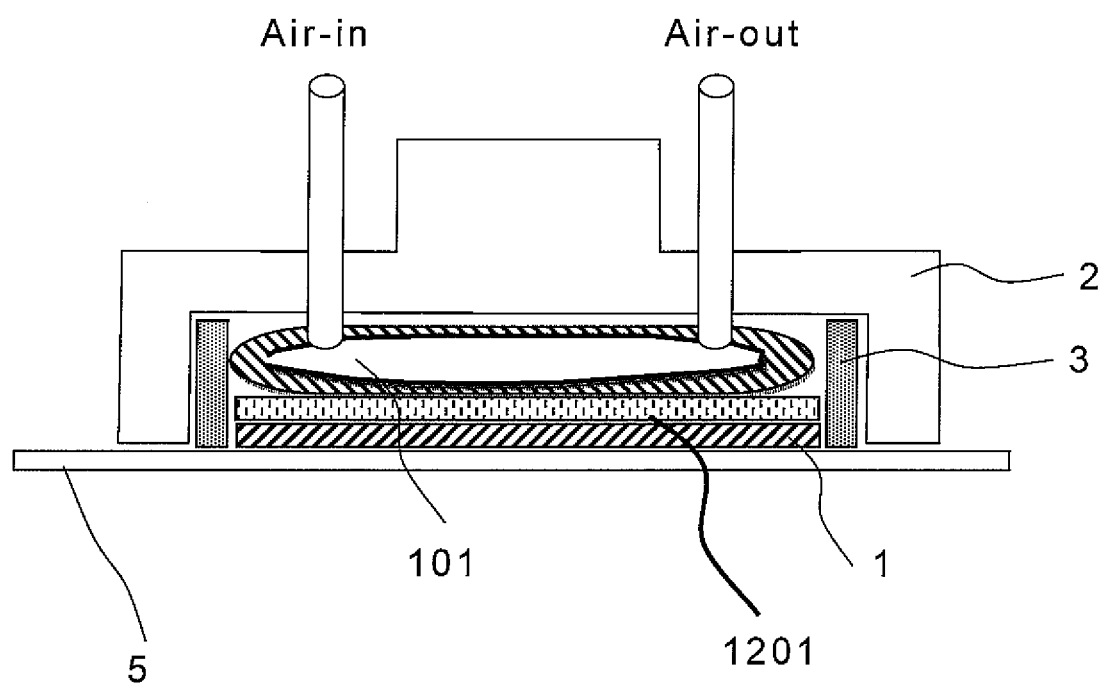
FIG. 12 is a schematic sectional view of a polishing head of a CMP apparatus according to a twelfth embodiment of the present invention.

FIG. 12 is a schematic sectional view of a twelfth embodiment of the present invention as a simple illustrating of an air bag alone out of components of a CMP apparatus. The twelfth embodiment has the feature of the first embodiment and additionally has a shock absorbing (gelatinous) sheet 1201 between the wafer 1 and the air bag 101.

An advantage of the shock absorbing (gelatinous) sheet 1201 sandwiched between the wafer 1 and the air bag 101 is that pressure locally applied from the air bag 101 is relieved and dispersed, thereby transmitting the pressure that presses down to the wafer 1 evenly. As is understood from the description given above, the twelfth embodiment has a feature in that the pressure that presses down on the wafer 1 can be evenly transmitted by relieving and dispersing pressure from the air bag 101 with the use of the shock absorbing (gelatinous) sheet 1201 sandwiched between the wafer 1 and the air bag 101.

Though omitted from the drawings, the same effect as that of the twelfth embodiment can be obtained by arranging the shock absorbing (gelatinous) sheet 1201 on the wafer 1 in the second embodiment to the eleventh embodiment. In addition, while an air bag is used in the description of this embodiment, this embodiment can be adapted from the pressure application method, which uses air gas, to the pressure application method, which uses liquid, by substituting the air bag with a water-tight, pressure-proof bag.

Figure 15:
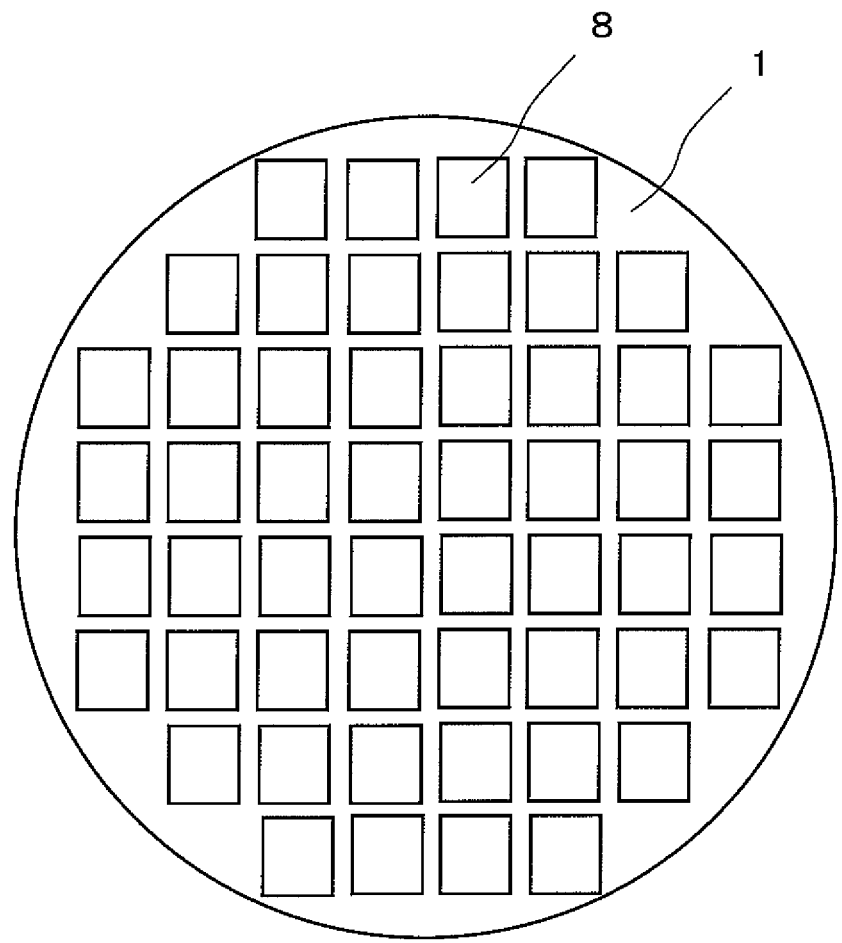
FIG. 15 is a plan view for illustrating a semiconductor integrated circuit that is manufactured according to an embodiment of the present invention.

FIG. 15 is a plan view for illustrating a semiconductor integrated circuit 8, which is manufactured by the embodiments described above. A plurality of semiconductor integrated circuits 8 are arranged two dimensionally on the front surface of the wafer 1 with a small perimeter left unoccupied. In manufacturing processes of the semiconductor integrated circuit 8, the CMP apparatus planarizes a surface of the semiconductor integrated circuit 8 by polishing the surface chemically and mechanically so that a metal film or an insulating film that is to be formed next is placed on a planarized surface. The CMP apparatus is used many times in manufacturing processes of the semiconductor integrated circuit 8, depending on the structure of the semiconductor integrated circuit 8, and high performance is naturally demanded of the CMP apparatus with respect to the flatness throughout the entire ware plane.

What is claimed is:

1. A polishing head of a CMP apparatus, comprising:
   a polishing pad;
   a first air bag and a second air bag, which are in contact with a rear surface of a wafer mounted on a front surface of the polishing pad, and which are configured to press a front surface of the wafer against the polishing pad; and
   a top ring surrounding the first air bag, the second air bag, and the wafer,
   the first air bag, which is in contact with a central portion of the wafer, and the second air bag, which is in contact with a peripheral portion of the wafer, being separate bag bodies, and
   the first air bag, which is in contact with the central portion of the wafer, has a first film thickness, and the second air bag, which is in contact with the peripheral portion of the wafer, has a second film thickness that is thicker than the first film thickness.

2. A polishing head according to claim 1, wherein the first air bag is a circular air bag in plan view, and the second air bag in plan view is a torus-shaped air bag arranged around the circular air bag.

3. A polishing head according to claim 1, wherein the first air bag is a circular air bag in plan view, and the second air bag in plan view is an aggregation of a plurality of circular air bags arranged around the first air bag and each smaller than the first air bag in size.

4. A polishing head according to claim 1, wherein the first air bag is an aggregation of a plurality of circular air bags in plan view, and the second air bag in plan view is an aggregation of a plurality of circular air bags arranged around the first air bag.

5. A polishing head according to claim 1, wherein the first air bag is a circular air bag in plan view, and the second air bag in plan view is a coiled-hose shape air bag arranged around the circular air bag.

6. A polishing head according to claim 1, wherein the first air bag is a first coiled-hose shape air bag in plan view, and the second air bag in plan view is an aggregation of a plurality of second coiled-hose shape air bags arranged around the first coiled-hose shape air bag and each smaller than the first coiled-hose shape air bag in size.

7. A polishing head according to claim 1, wherein the first air bag is an aggregation of a plurality of coiled-hose shape air bags in plan view, and the second air bag in plan view is an aggregation of a plurality of coiled-hose shape air bags arranged around the first coiled-hose shape air bag.

* * * * *